United States Patent
Yang et al.

(10) Patent No.: US 10,013,919 B2
(45) Date of Patent: Jul. 3, 2018

(54) SCANNING DRIVE CIRCUIT AND ORGANIC LIGHT-EMITTING DISPLAY

(71) Applicants: KUNSHAN NEW FLAT PANEL DISPLAY TECHNOLOGY CENTER CO., LTD., Jiangsu (CN); KUNSHAN GO-VISIONOX OPTO-ELECTRONICS CO., LTD., Jiangsu (CN)

(72) Inventors: Nan Yang, Jiangsu (CN); Siming Hu, Jiangsu (CN); Tingting Zhang, Jiangsu (CN); Xiaobao Zhang, Jiangsu (CN); Hajime Nagai, Jiangsu (CN); Xiuqi Huang, Jiangsu (CN)

(73) Assignees: KUNSHAN NEW FLAT PANEL DISPLAY TECHNOLOGY CENTER CO. LTD., Jiangsu (CN); KUNSHAN GO-VISIONOX OPTO-ELECTRONICS CO., LTD., Jiangsu (CN)

( * ) Notice: Subject to any disclaimer, the term of this patent is extended or adjusted under 35 U.S.C. 154(b) by 273 days.

(21) Appl. No.: 15/107,676

(22) PCT Filed: Dec. 29, 2014

(86) PCT No.: PCT/CN2014/095370
§ 371 (c)(1),
(2) Date: Jun. 23, 2016

(87) PCT Pub. No.: WO2015/101261
PCT Pub. Date: Jul. 9, 2015

(65) Prior Publication Data
US 2016/0321999 A1     Nov. 3, 2016

(30) Foreign Application Priority Data

Dec. 30, 2013 (CN) .......................... 2013 1 0744988
Sep. 12, 2014 (CN) .......................... 2014 1 0464972

(51) Int. Cl.
*G09G 3/3266* (2016.01)
*G11C 19/28* (2006.01)

(52) U.S. Cl.
CPC ........... *G09G 3/3266* (2013.01); *G11C 19/28* (2013.01); *G09G 2310/0286* (2013.01); *G09G 2310/08* (2013.01)

(58) Field of Classification Search
CPC ........... G09G 3/32–3/3291; G09G 2310/0286
See application file for complete search history.

(56) References Cited

U.S. PATENT DOCUMENTS 7,109,953 B2    9/2006  Abe
7,920,109 B2 *  4/2011  Chung ................. G09G 3/3266
                                                    345/82

(Continued)

FOREIGN PATENT DOCUMENTS

CN    101256736 A    9/2008
CN    202058418 U    11/2011

(Continued)

OTHER PUBLICATIONS

International Search Report for Application No. PCT/CN2014/095370 dated Apr. 3, 2015, 2 pages.

(Continued)

*Primary Examiner* — Patrick F Marinelli
(74) *Attorney, Agent, or Firm* — Seyfarth Shaw LLP

(57) ABSTRACT

A scanning drive circuit is provided. Compared with traditional scan drive circuits, less clock signals and transistors are used. This can greatly enhance the reliability of the circuit, and reduce costs of design and manufacture. An organic light-emitting display based on the scanning drive circuit is also disclosed.

10 Claims, 4 Drawing Sheets

(56) References Cited

U.S. PATENT DOCUMENTS

| | | | |
|---|---|---|---|
| 7,936,332 B2* | 5/2011 | Lee | G09G 3/3677 345/100 |
| 8,130,183 B2* | 3/2012 | Chung | G11C 19/184 345/76 |
| 8,299,982 B2* | 10/2012 | Chung | G09G 3/3266 345/76 |
| 8,368,675 B2* | 2/2013 | Park | G09G 3/3266 345/205 |
| 8,482,492 B2* | 7/2013 | Kim | G09G 3/3266 345/76 |
| 8,542,225 B2* | 9/2013 | Han | H03K 3/356139 345/208 |
| 8,717,257 B2* | 5/2014 | Kim | G09G 3/3233 315/169.3 |
| 8,743,024 B2* | 6/2014 | Kim | G09G 3/3233 315/169.3 |
| 8,810,552 B2* | 8/2014 | Chung | G11C 19/28 345/100 |
| 8,854,349 B2* | 10/2014 | Eom | G09G 3/3233 345/100 |
| 8,866,859 B2* | 10/2014 | Chung | G09G 3/3266 345/690 |
| 8,902,144 B2 | 12/2014 | Umezaki | |
| 9,129,562 B2* | 9/2015 | Jang | G09G 3/3266 |
| 9,277,622 B2* | 3/2016 | Kim | H05B 37/02 |
| 9,311,856 B2* | 4/2016 | Park | G09G 3/3266 |
| 9,368,069 B2* | 6/2016 | Woo | G09G 3/3266 |
| 9,454,934 B2* | 9/2016 | Woo | G09G 3/3266 |
| 9,786,384 B2* | 10/2017 | Lee | G11C 19/287 |
| 9,847,062 B2* | 12/2017 | Hu | G09G 3/3266 |
| 2003/0234754 A1 | 12/2003 | Abe | |
| 2007/0046608 A1* | 3/2007 | Chung | G09G 3/3266 345/92 |
| 2007/0063933 A1* | 3/2007 | Chung | G09G 3/3266 345/76 |
| 2007/0296662 A1* | 12/2007 | Lee | G09G 3/3677 345/87 |
| 2008/0074359 A1* | 3/2008 | Chung | G09G 3/3266 345/76 |
| 2008/0211744 A1 | 9/2008 | Lee | |
| 2010/0007598 A1 | 1/2010 | Chan | |
| 2010/0013824 A1* | 1/2010 | Kim | G09G 3/3266 345/214 |
| 2010/0110050 A1* | 5/2010 | Park | G09G 3/3266 345/205 |
| 2010/0134396 A1 | 6/2010 | Umezaki | |
| 2010/0238143 A1 | 9/2010 | Liu | |
| 2010/0327955 A1 | 12/2010 | Umezaki | |
| 2011/0019853 A1 | 1/2011 | Chang | |
| 2011/0102398 A1* | 5/2011 | Han | H03K 3/356139 345/209 |
| 2011/0141091 A1* | 6/2011 | Eom | G09G 3/3233 345/211 |
| 2011/0193892 A1* | 8/2011 | Eom | G09G 3/3266 345/690 |
| 2012/0062525 A1* | 3/2012 | Kim | G09G 3/3233 345/204 |
| 2012/0062608 A1* | 3/2012 | Kim | G09G 3/3233 345/690 |
| 2012/0139962 A1* | 6/2012 | Chung | G09G 3/3266 345/690 |
| 2012/0170707 A1 | 7/2012 | Hsu | |
| 2012/0176417 A1* | 7/2012 | Jang | G09G 3/3266 345/690 |
| 2012/0188290 A1* | 7/2012 | Park | G09G 3/3266 345/690 |
| 2012/0212517 A1 | 8/2012 | Ahn | |
| 2013/0285888 A1* | 10/2013 | Chung | G11C 19/28 345/55 |
| 2013/0342584 A1* | 12/2013 | Song | G09G 3/30 345/690 |
| 2014/0111092 A1* | 4/2014 | Kim | H05B 37/02 315/127 |
| 2014/0160000 A1 | 6/2014 | Ma | |
| 2015/0170568 A1* | 6/2015 | Lee | G09G 3/3233 345/690 |
| 2015/0243209 A1* | 8/2015 | In | G09G 3/3208 345/76 |
| 2016/0314745 A1* | 10/2016 | Hu | G09G 3/3266 |
| 2016/0321999 A1* | 11/2016 | Yang | G09G 3/3266 |

FOREIGN PATENT DOCUMENTS

| | | |
|---|---|---|
| CN | 102857207 A | 1/2013 |
| CN | 102881248 A | 1/2013 |
| CN | 103021358 A | 4/2013 |
| CN | 104183219 A | 12/2014 |
| EP | 1763003 A | 3/2007 |
| EP | 1965371 A | 9/2008 |
| JP | 5-224629 A | 9/1993 |
| JP | 2008077034 A | 3/2008 |
| JP | 2011164606 A | 8/2011 |
| KR | 10-2010-0008635 A | 1/2010 |
| TW | 200609885 A | 3/2006 |
| TW | 201003619 A | 1/2010 |
| TW | 201035940 A | 10/2010 |
| TW | 201142785 A | 1/2011 |
| TW | 201227650 A | 7/2012 |
| TW | 201301289 A | 1/2013 |
| TW | 201501127 A | 1/2015 |
| WO | 2014015633 A1 | 1/2014 |

OTHER PUBLICATIONS

Search Report & First Office Action for Priority Chinese Patent Application No. 201410464972.6 dated Dec. 2, 2015, 7 pages.
Second Office Action for Priority Chinese Patent Application No. 201410464972.6 dated Jun. 20, 2016, 4 pages.
Office Action (Notice of Grounds for Rejection) for Japanese Patent Application No. 2016-543693 dated May 16, 2017, 3 pages.
The extended European Search Report Patent Application No. 14876723.9 dated Aug. 1, 2017, 10 pages.
Office Action for Taiwan Patent Application No. 103146184 dated Nov. 18, 2014, 4 pages.
Written Opinion for Application No. PCT/CN2014/095370 dated Apr. 3, 2015, 7 pages.

* cited by examiner

SCANNING DRIVE CIRCUIT AND ORGANIC
LIGHT-EMITTING DISPLAY

CROSS REFERENCE TO RELATED
APPLICATIONS

This is a National Stage application of PCT/CN2014/ 095370, filed Dec. 29, 2014, and claims priority to Chinese Patent Application Serial No. CN 201410464972.6, filed Sep. 12, 2014, and Chinese Patent Application Serial No. CN 201310744988.8, filed Dec. 30, 2013, the disclosures of which are incorporated herein by reference.

FIELD

The present disclosure relates to the field of scanning drive circuit, and particularly to a scanning drive circuit for scanning driving an organic light emitting device pixel circuit, and an organic light-emitting display.

BACKGROUND

An organic light-emitting display is a display that is equipped with Organic Light-emitting Diodes (OLED) as its light-emitting device. Compared to the current mainstream flat-panel display technology of Thin Film Transistor Liquid Crystal Display (TFT-LCD), the organic light-emitting displays have the advantages of high contrast, wide angle of view, low power consumption and thinner volume, etc. As one of the technologies that draw the most attention, it is expected to become the next generation of flat display technology after LCD.

A traditional organic light-emitting display includes a data driver for supplying data signals to a data bus, a first scan driver for sequentially supplying scanning signals to one scan line, a second scan driver for sequentially supplying scanning signals to another scan line, a timing controller for supplying timing signals and high and low level (Here "level" refers to "electrical level", the same below.) signals to the first scan driver and the second scan driver, and a multiple-pixel display unit. The function of the first scan driver and the second scan driver is to sequentially generate driver signals to be supplied to a display panel, and control the brightness of the pixels of the display panel.

However, since each cascade structure of the traditional first scan driver and second scan driver includes relatively more input clock signals (at least three) and also includes a large amount of transistors (more than ten), the risk of problems is increased accordingly, together with high costs of design and manufacture. Thus, it is difficult to ensure the reliability of the product.

SUMMARY

Based on the above, it is necessary to provide a scanning drive circuit that can reduce the number of clock signals and transistors. Further, an organic light-emitting display is also provided.

According to an aspect of the disclosure, a scanning drive circuit includes a first scan driver for sequentially outputting selection signals and a second scan driver for sequentially outputting transmission signals, the first scan driver including a plurality of first cascade structures and the second scan driver including a plurality of second cascade structures, each cascade structure of the first cascade structures and/or the second cascade structures including: a first transistor including an input terminal connected to a scanning signal output terminal or a scanning signal input terminal of a precedent cascade structure, a gate terminal connected to a first clock end, and an output terminal; a second transistor including a gate terminal connected to the output terminal of the first transistor, an input terminal connected to a second clock end, and an output terminal connected to the scanning signal output terminal; a third transistor including an input terminal connected to a first level end, a gate terminal connected to the scanning signal output terminal, and an output terminal; a fourth transistor including an input terminal connected to the output terminal of the third transistor, a gate terminal connected to the first clock end, and an output terminal connected to a second level end; a fifth transistor including an input terminal connected to the first level end, a gate terminal connected to the output terminal of the third transistor, and an output terminal connected to the scanning signal output terminal; a sixth transistor including an input terminal connected to the first level end, a gate terminal connected to the scanning signal output terminal, and an output terminal; a seventh transistor including an input terminal connected to the output terminal of the sixth transistor, a gate terminal connected to the first clock end, and an output terminal connected to the second level end; an eighth transistor including an input terminal connected to the first level end, a gate terminal connected to the scanning signal output terminal, and an output terminal connected to a driving signal output terminal; a ninth transistor including an input terminal connected to the driving signal output terminal, a gate terminal connected to the output terminal of the sixth transistor, and an output terminal connected to a third level end; and a first capacitor connected between the gate terminal and the output terminal of the second transistor.

In one embodiment, the signals received by the first clock end and the second clock end of each cascade structure of the first cascade structures and the second cascade structures are the same in frequency. The signal received by the second clock end is at low level when the signal received by the first clock end is at high level, and the signal received by the second clock end is at high level when the signal received by the first clock end is at low level.

In one embodiment, the first transistor, the second transistor, the third transistor, the fourth transistor, the fifth transistor, the sixth transistor, the seventh transistor, the eighth transistor and the ninth transistor are Thin Film Field Effect Transistors.

In one embodiment, a second capacitor is connected between the first level end and the gate terminal of the sixth transistor.

In one embodiment, a third capacitor is connected between the second level end and the gate terminal of the ninth transistor.

In one embodiment, a third capacitor is connected between the driving signal output terminal and the gate terminal of the ninth transistor.

In one embodiment, the third level end and the second level end are the same level end.

In one embodiment, the voltage value inputted from the third level end is smaller than the voltage value inputted from the second level end.

In one embodiment, the voltage inputted from the first level end is high level, and the voltages inputted from the second and the third level ends are high level.

Only two clock signals and nine transistors are used in the above scan drive circuit, less than the traditional scan drive circuits. This can greatly enhance the reliability of the circuit, and reduce costs of design and manufacture.

According to an aspect of the disclosure, an organic light-emitting display includes a pixel circuit, a data driver and a timing controller, and further includes the above scanning drive circuit, the timing controller supplying timing signals and high and low level signals to the first clock end, the second clock end, the scanning signal input terminal, the first level end, the second level end and the third level end of the scanning drive circuit, the driving signal output terminal of the scanning drive circuit being connected to the driving signal input terminal of the pixel circuit to output driving signals for driving the pixel circuit.

Less transistors are used in an organic light-emitting display applied with the above scanning drive circuit, which can greatly enhance the reliability of the product, and reduce costs of design and manufacture.

DETAILED DESCRIPTION OF THE PREFERRED EMBODIMENTS

The embodiments of the disclosure will now be described in detail with reference to the accompany drawings. To facilitate understanding, the terminal numerals are used in the description to represent corresponding signals.

Example 1

Figure 1:
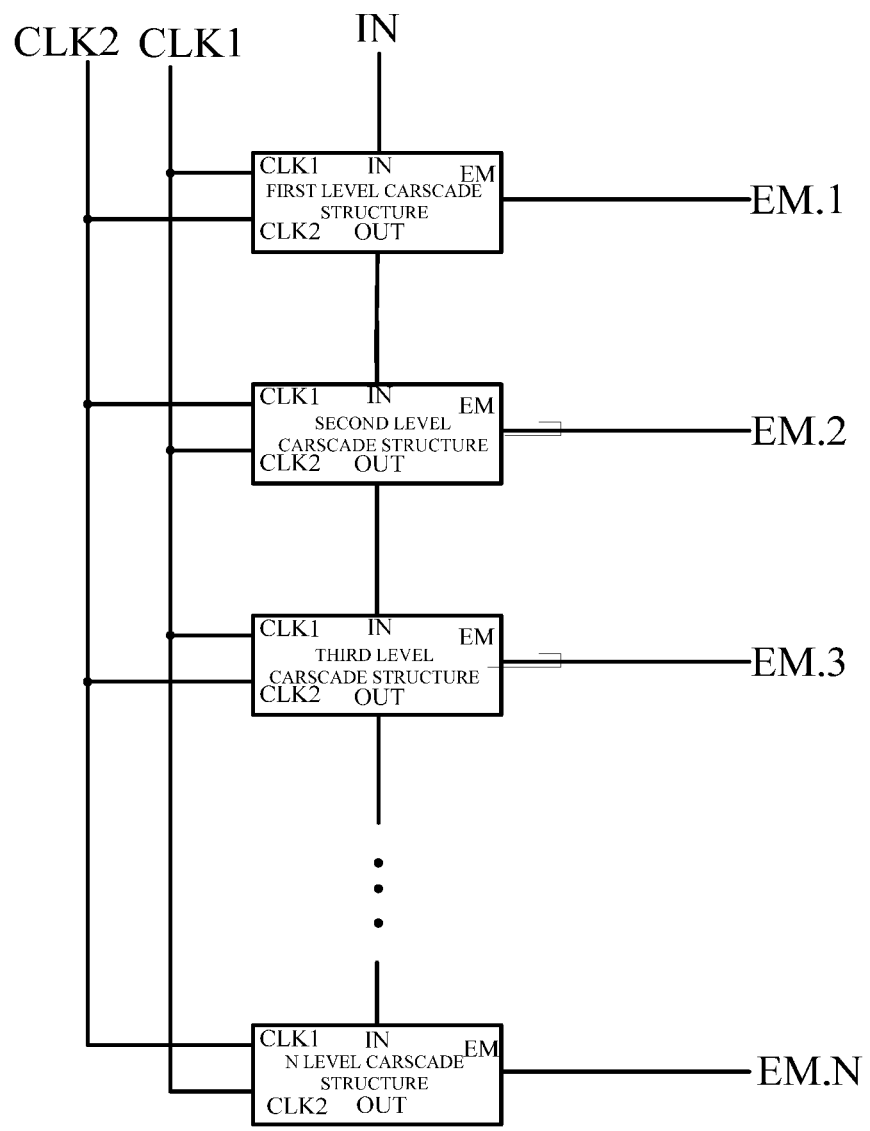
FIG. 1 is a module schematic diagram of a first scan driver of a scanning drive circuit according to Example 1 of the disclosure.
Figure 2:
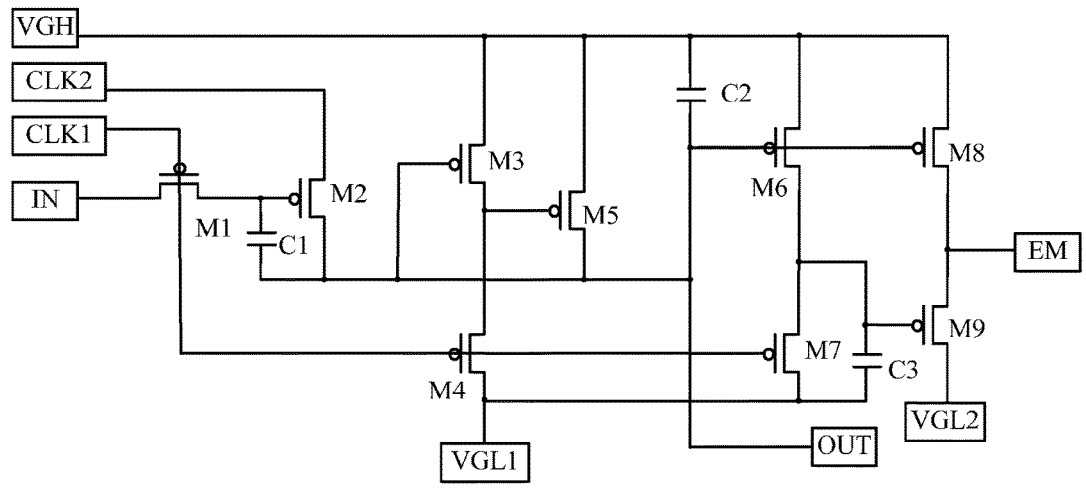
FIG. 2 is a circuit diagram of a cascade structure of the first scan driver of FIG. 1.

Referring to FIG. 1 and FIG. 2, a scanning drive circuit is provided in this embodiment. The scanning drive circuit includes a first scan driver for sequentially outputting selection signals and a second scan driver for sequentially outputting transmission signals. The first scan driver includes a plurality of first cascade structures and the second scan driver includes a plurality of second cascade structures. Each cascade structure of the first cascade structures and/or the second cascade structures may have the following structure. In this embodiment, each cascade structure of the first cascade structures and the second cascade structures includes a first transistor M1, a second transistor M2, a third transistor M3, a fourth transistor M4, a fifth transistor M5, a sixth transistor M6, a seventh transistor M7, an eighth transistor M8, a ninth transistor M9, a first capacitor C1, a second capacitor C2, a third capacitor C3, a scanning signal input terminal IN, a scanning signal output terminal OUT, a first clock end CKL1, a second clock end CLK2, a first level end VGH, a second level end VGL1, a third level end VGL2 and a driving signal output terminal EM.

The first transistor M1 includes an input terminal connected to the scanning signal output terminal OUT or the scanning signal input terminal IN of a precedent cascade structure, a gate terminal connected to the first clock end CKL1, and an output terminal. The second transistor M2 includes a gate terminal connected to the output terminal of the first transistor M1, an input terminal connected to the second clock end CKL2, and an output terminal connected to the scanning signal output terminal OUT. The third transistor M3 includes an input terminal connected to the first level end VGH, a gate terminal connected to the scanning signal output terminal OUT, and an output terminal. The fourth transistor M4 includes an input terminal connected to the output terminal of the third transistor M3, a gate terminal connected to the first clock end CKL1, and an output terminal connected to the second level end VGL1. The fifth transistor M5 includes an input terminal connected to the first level end VGH, a gate terminal connected to the output terminal of the third transistor M3, and an output terminal connected to the scanning signal output terminal OUT. The sixth transistor M6 includes an input terminal connected to the first level end VGH, a gate terminal connected to the scanning signal output terminal OUT, and an output terminal. The seventh transistor M7 includes an input terminal connected to the output terminal of the sixth transistor M6, a gate terminal connected to the first clock end CKL1, and an output terminal connected to the second level end VGL1. The eighth transistor M8 includes an input terminal connected to the first level end VGH, a gate terminal connected to the scanning signal output terminal OUT, and an output terminal connected to a driving signal output terminal EM. The ninth transistor M9 includes an input terminal connected to the driving signal output terminal EM, a gate terminal connected to the output terminal of the sixth transistor M6, and an output terminal connected to the third level end VGL2.

The gate electrode of the first transistor M1, the gate electrode of the fourth transistor M4 and the gate electrode of the seventh transistor M7 are shorted, a second electrode of the first transistor M1, the gate electrode of the second transistor M2 and the first side of the first capacitor C1 are shorted, the second electrode of the second transistor M2, the gate electrode of the third transistor M3, the second electrode of the fifth transistor M5, the gate electrode of the sixth transistor M6, the gate electrode of the eighth transistor M8, the first side of the first capacitor C1 and the second side of the second capacitor C2 are shorted, the first electrode of the third transistor M3, the first electrode of the fifth transistor M5, the first electrode of the sixth transistor M6, the first electrode of the eighth transistor M8 and the first side of the second capacitor C2 are shorted, the second electrode of the third transistor M3, the first electrode of the fourth transistor M4 and the gate electrode of the fifth transistor M5 are shorted, the second electrode of the fourth transistor M4, the second electrode of the seventh transistor M7 and the second side of the third capacitor C3 are shorted, the second electrode of the sixth transistor M4, the first electrode of the seventh transistor M7, the first side of the third transistor M3 and the gate electrode of the ninth transistor M9 are shorted, the second electrode of the eighth transistor M8 and the first electrode of the ninth transistor M9 are shorted.

The first electrode of the first transistor M1 is connected to the scanning signal input terminal IN, the second electrode of the second transistor M2 is connected to the scanning signal output terminal OUT, the gate electrode of the first transistor M1 is connected to the clock end CLK1, the first electrode of the second transistor M2 is connected to the second clock end CLK2, the first electrode of the third transistor M3 is connected to the first level end VGH, the second electrode of the fourth transistor M4 is connected to the second level end VGL1, the second electrode of the ninth transistor M9 is connected to the second low level signal input terminal VGL2, and the second electrode of the eighth transistor M8 is connected to the scanning signal output terminal EM.

High level signals are inputted from the first level end VGH (which means the input voltage of the first level end VGH is positive), the first clock signal is inputted from the first clock end CLK1, the second clock signal is inputted from the second clock end CLK2, the scanning signal is inputted from the scanning signal input terminal IN, the first low level signal is inputted from the second level end VGL1 (which means that the input voltage of the second level end VGL1 is negative), the second low level signal is inputted from the second low level signal input terminal VGL2 (which means that the input voltage of the second level signal input terminal VGL2 is negative), the driving signal is outputted from the driving signal output terminal EM, and the output scanning signal is outputted from the scanning signal output terminal OUT.

The first transistor M1, the second transistor M2, the third transistor M3, the fourth transistor M4, the fifth transistor M5, the sixth transistor M6, the seventh transistor M7, the eighth transistor M8 and the ninth transistor M9 are Field Effect Transistors, preferably are P-channel type Field Effect Transistors. More specifically, they are Thin Film Field Effect Transistors (TFT), and preferably are P-channel type Thin Film Field Effect Transistors.

Since each of the cascade structures of the first scan driver and the second scan driver of the scanning drive circuit includes nine transistors and requires only two clock signals, it is possible to reduce the number of transistors used by the scanning drive circuit. Therefore, this greatly enhances the reliability of the product, and reduces the costs of design and manufacture. In addition, the presence of the sixth transistor M6, the seventh transistor M7, the eighth transistor M8 and the ninth transistor M9 enables more a precise and reliable output terminal of the driving signal output terminal EM of the scanning drive circuit.

It should be noted that the second capacitor C2 and the third capacitor C3 can also be omitted when there is a load capacitance connected to the scanning signal output terminal OUT. In this embodiment, the second capacitor C2 and the third capacitor C3 are provided to reduce the current of the first level end VGH, the second level end VGL1 and the third level end VGL2.

The connection relationship of the plurality of cascade structures will now be described taken the first scan driver as an example.

The first scan driver includes N levels of cascade structures. The scanning signal output terminal of the first level cascade structure is connected to the scanning signal input terminal of the second level cascade structure, and the scanning signal output terminal of the second level cascade structure is connected to the scanning signal input terminal of the third level cascade structure, and so on. The scanning signal output terminal of the N−1 level cascade structure is connected to the scanning signal input terminal of the N level cascade structure.

The first clock end of an odd numbered level cascade structure is shorted to the second clock end of an even numbered level cascade structure, and the second clock end of an odd numbered level cascade structure is shorted to the first clock end of an even numbered level cascade structure.

The first clock signal CLK1 is inputted into the first clock end of the first level cascade structure, and the second clock signal CLK2 is inputted into the second clock end of the first level cascade structure.

The driving signal output terminals of each levels of the cascade structures output respectively output the driving signals EM.1, EM.2, EM.3 . . . EM.N to the plurality of pixel circuits of the organic light-emitting display to drive the pixel circuits.

Figure 3:
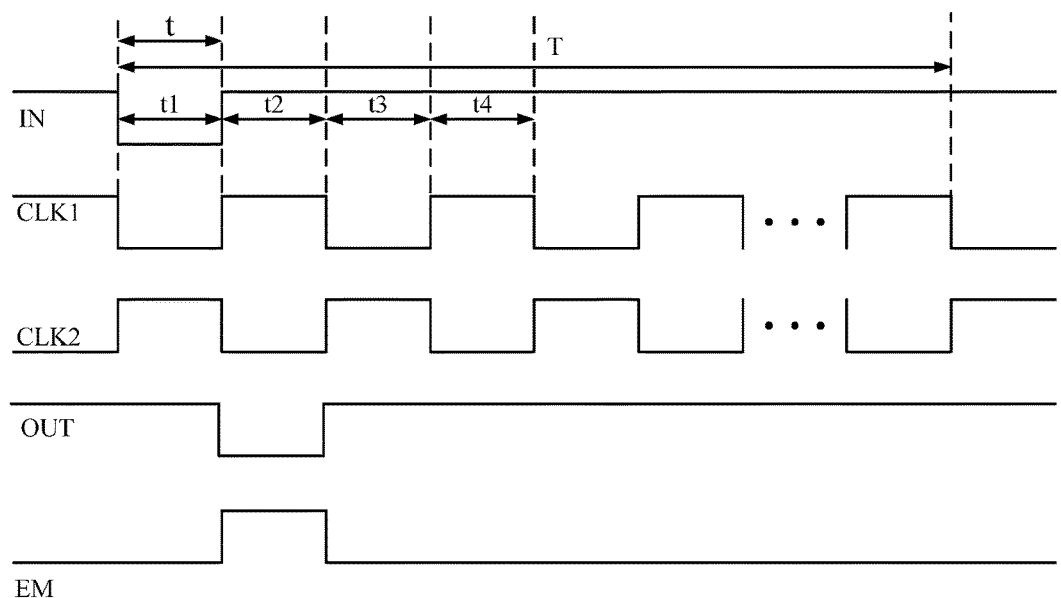
FIG. 3 is a timing diagram of a portion of the signals of the first scan driver of FIG. 1.

The working principle of the circuit in a scanning cycle T will now be described with reference to the drawings. Referring to FIG. 1, FIG. 2 and FIG. 3, the voltage inputted from the first level end VGH is high, and the voltage inputted from the second level end VGL1 and the third level end VGL2 is low. The signals received by the first clock end CLK1 and the second clock end CLK2 of each cascade structure of the first cascade structures and the second cascade structures are the same in frequency. The signal received by the second clock end CLK2 is low level when the signal received by the first clock end CLK1 is high level, and the signal received by the second clock end CLK2 is high level when the signal received by the first clock end CLK1 is low level. This means that the signals received by the first clock end CLK1 and the second clock end CLK2 of each cascade structure of the first cascade structures and the second cascade structures are opposite in phase. To better understand, the terminal numerals are used to represent corresponding signals, e.g. the scanning signal IN, the output scanning signal OUT, the first clock signal CKL1, the second clock signal CKL2, and the driving signal EM. Different components are distinguished by using reference numerals, for example, the first transistor M1 as transistor M1, the first capacitor C1 as capacitor C1.

In the first clock cycle t1: the clock signal (CLK1) received by the first clock end CLK1 is low level, the transistors M1, M4 and M7 are ON, IN is low level (capacitor C1 is being charged), the clock signal (CLK2) received by the second clock end CLK2 is high level, and thus transistor M2 is ON, with the output scanning signal OUT being high level; the transistor M7 is ON and thus the gate terminal of the transistor M9 is low level; M9 is ON and EM is low level.

In the second clock cycle t2: CLK1 is high level, Transistors M1, M4 and M7 are OFF, and capacitor C1 discharges and CLK2 is low level. Due to the coupling of the capacitor C1, the gate terminal of the transistor M2 becomes lower level, such that M2 is ON, M3 is ON, and M5 is OFF, thus OUT is low level; M2 is ON, causing M6 and M8 to be ON and M9 to be OFF, and thus EM is high level.

In the third clock cycle t3: CLK1 is low level, and CLK2 is high level. Transistors M1, M4 and M7 are ON, IN is high level, and thus M2 is OFF; M4 is ON and thus M5 is ON (capacitor C2 being charged), and OUT is high level; the transistor M7 is ON and thus the gate terminal of the transistor M9 is low level ((Capacitor C3 being charged), M9 is ON, and EM is low level.

In the fourth clock cycle t4: CLK1 is high level, CLK2 is low level, and IN is high level. Transistors M1, M2, M4 and M7 are OFF, so M3 and M5 are OFF, and the capacitor C2 discharges, and thus OUT is high level; capacitor C3 discharges and thus M9 is ON, and EM is low level.

Accordingly, OUT is at high level in the rest of the scanning cycle, and EM is at low level in the rest of the scanning cycle, which enables the output of the driving signal EM and the shift of one clock signal of the scanning signal IN (i.e., OUT is shifted backward by one clock signal cycle than IN).

OUT is shifted backward by one clock signal cycle than IN. In addition, because each of the cascade structures are connected in opposite parity by CLK1 and CLK2, and CLK1 and CLK2 are also staggered by their opposition in high and low levels, i.e., the synchronized shifting of CLK1, CLK2 and OUT is realized. Thus, each cascade structure can output the required driving signal (EM.1, EM.2, EM.3 . . . EM.N).

Only two clock signals and nine transistors are used in the above scanning drive circuit, less than the traditional scan drive circuits. This can greatly enhance the reliability of the circuit, and reduce costs of design and manufacture.

Example 2

Figure 4:
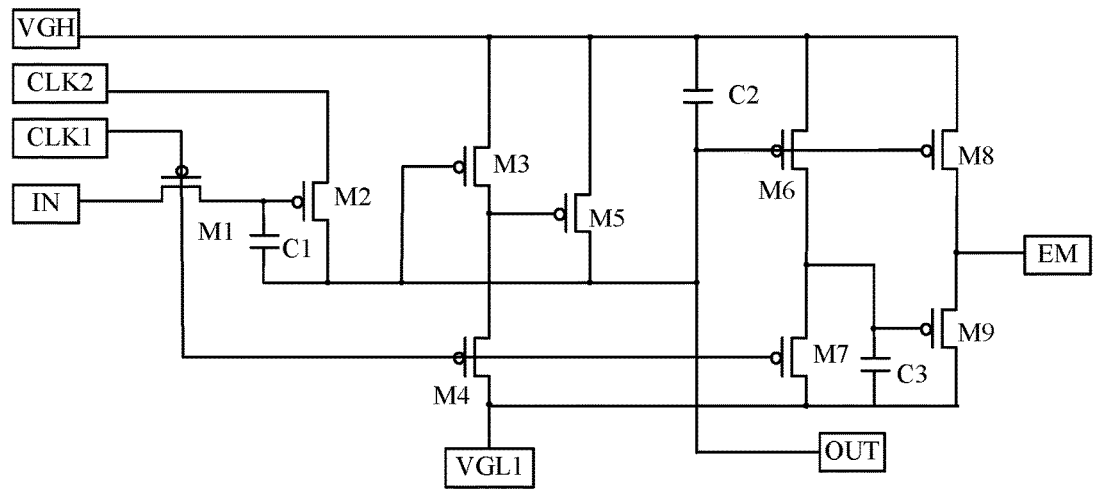
FIG. 4 is a circuit diagram of a cascade structure of a first scan driver of a scanning drive circuit according to Example 2 of the disclosure.

Referring to FIG. 4, in this embodiment, the first low level signal (VGL1) and the second low level signal (VGL2) are the same low level signal. That is, the second low level signal input terminal VGL2 is connected to the second low level VGL1, which is equivalent to that the second electrode of the ninth transistor M9 is connected directly to the second level end VGL1, and at this time the input voltage of the first low level signal (VGL1) and the second low level signal (VGL2) are the same. During the operation of the circuit, when the seventh Transistor M7 is ON, the gate electrode of the ninth transistor M9 is low level vgl1+Vth (vgl1 is the voltage value of the first low level signal, and Vth is the absolute value of the threshold voltage of the P-channel type Thin Film Field Effect Transistor), thus, the ninth transistor M9 is ON, and at this time the source of the ninth transistor M9 is low level (vgl1). This is equivalent to that the gate electrode and drain of the ninth transistor M9 are shorted, and the ninth transistor M9 forms a diode connection. The source output voltage of the ninth transistor M9 is vgl1+Vth, which causes the driving signal to be higher than the required vgl1 by Vth. As a result, in order to keep the driving signal outputted by the driving signal output terminal EM as vgl1, the voltage value (vgl2) of the second low level signal is smaller than the voltage value (vgl1) of the first low level signal in other embodiments, and preferably the voltage value (vgl2) of the second low level signal is smaller by Vth than the voltage value (vgl1) of the first low level signal.

It should be noted that the second capacitor C2 can be omitted when there is a load capacitance connected to the scanning signal output terminal OUT, but the third capacitor C3 cannot be omitted. The function of the third capacitor C3 is to stabilize the gate electrode voltage of the ninth transistor M9.

The scanning signal IN is a low level signal in the first clock cycle t of a scanning cycle T of the scanning signal IN, and is a high level signal in the rest of the time; when the scanning signal IN is a low level signal, the first clock signal CLK1 is also a low level signal. The first clock signal CLK1 and the second clock signal CLK2 are the same in frequency. When the first clock signal CLK1 is high level, the second clock signal CLK2 is low level, and when the first clock signal CLK1 is low level, the second clock signal CLK2 is high level. That is, the scanning signal IN is synchronized in the first clock cycle t of a scanning cycle T to low level with the first clock signal CLK1.

Example 3

Figure 5:
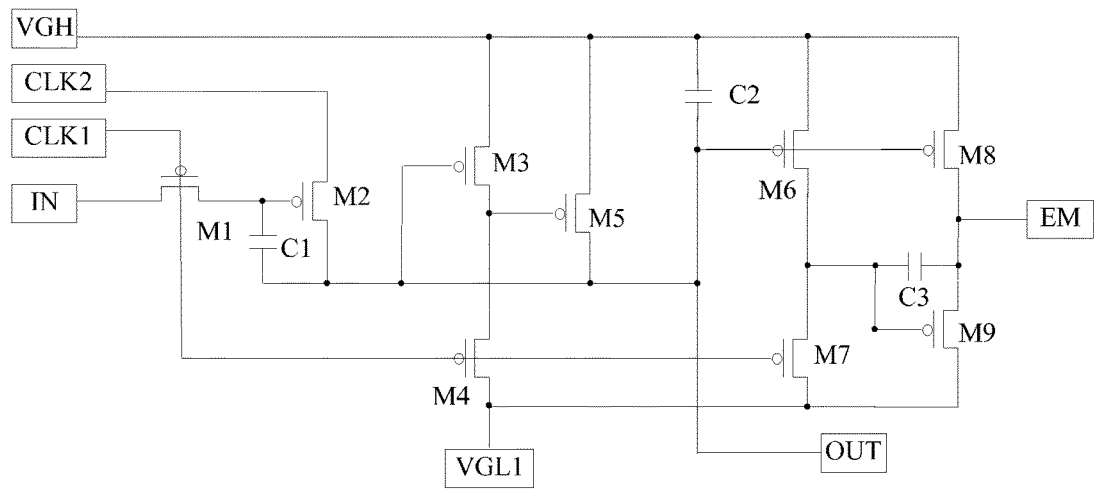
FIG. 5 is a circuit diagram of a cascade structure of a first scan driver of a scanning drive circuit according to Example 3 of the disclosure.

In this embodiment, it is possible to improve the swift high level transformation of the input signal EM by only changing the connection of the third capacitor C3. Specifically, the third capacitor C3 is connected between the driving signal output terminal EM and the gate terminal of the ninth transistor M9, as illustrated in FIG. 5.

It should be noted that the second capacitor C2 can be omitted when there is a load capacitance connected to the scanning signal output terminal OUT, but the third capacitor C3 cannot be omitted. The third capacitor C3 has a positive feedback effect.

During the operation of the circuit, when flipping from the first clock cycle t1 to the second clock cycle t2, the output signal EM is changed swiftly from the low level to the high level by the voltage jumping across the third capacitor C3 and the positive feedback effect. When flipping from the second clock cycle t2 to the third clock cycle t3, the output signal EM is changed swiftly from the high level to the low level by the voltage jumping across the third capacitor C3 and the positive feedback effect. In the present embodiment the third capacitor C3 is used to provide positive feedback for stable and swift output terminal of high and low level. Thus, it is possible to enhance the load capacity and transformation ability between the high and low levels of the drive circuit, making the output terminal of high and low levels closer to the power level.

Figure 6:
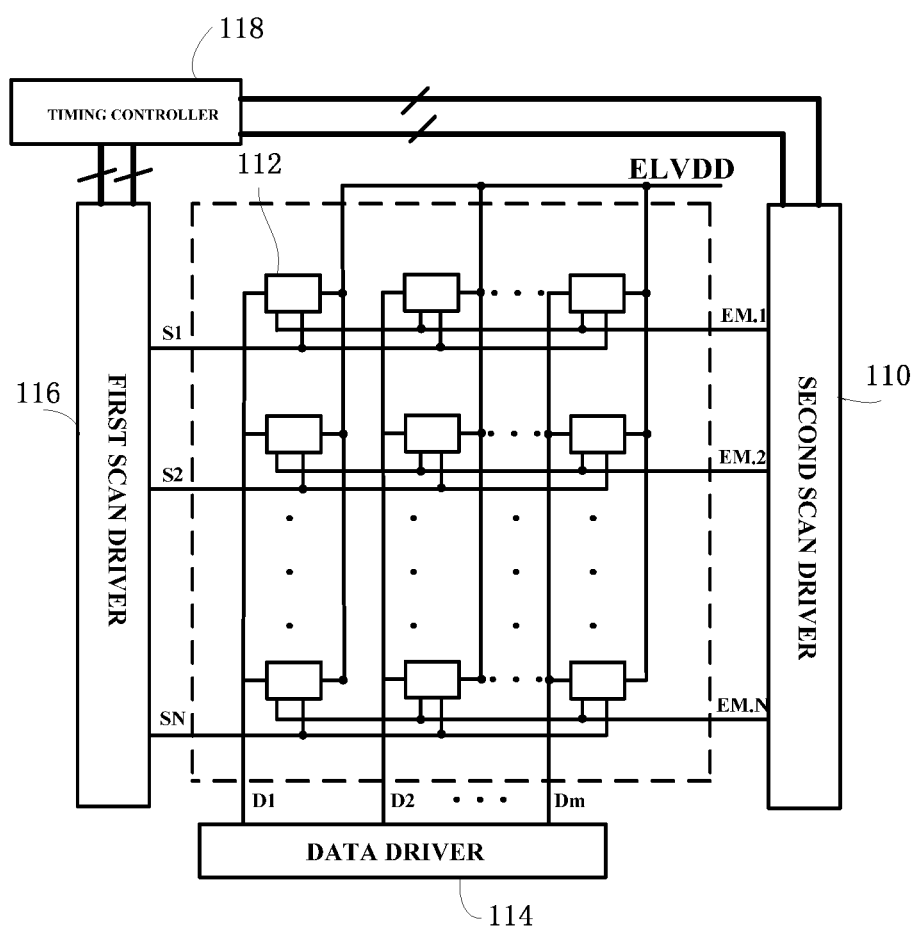
FIG. 6 is schematic diagram of the circuit module of an organic light-emitting display of according to an embodiment of the disclosure.

Referring to FIG. 6, an organic light-emitting display is provided, which includes a scanning drive circuit of any of the above Embodiments One to Three, and a plurality of pixel circuits 112 of the organic light-emitting display. The scanning drive circuit includes a first scan driver 110 and a second scan driver 116. The driving signal output terminal (EM.1, EM.2, EM.3 . . . EM.N) of each cascade structure of the first scan driver 110 is connected a driving signal input terminal of the pixel circuit 112 of the organic light-emitting display, so as to output driving signal (EM.1, EM.2, EM.3 . . . EM.N) to drive the pixel circuit 112 of the organic light-emitting display.

The organic light-emitting display further includes a data driver 114 and a timing controller 118. The data driver 114 is configured to supply data signal to the pixel circuit 112 of the organic light-emitting display, the second scan driver 116 is configured to supply scanning signal to the pixel circuit 112 of the organic light-emitting display, the timing controller 118 is configured to supply timing signal and high and low level signals to the first clock end, the second clock end, the scanning signal input terminal, the first level end, the second level end and the third level end of the first scan driver 110 and the second scan driver 116, and ELVDD is configured to supply power signal to all the pixel circuits 112 of the organic light-emitting display.

With the organic light-emitting display using the above scanning drive circuit, it is possible to greatly enhance the reliability of the circuit, and reduce costs of design and manufacture.

The above are embodiments of the invention described in detail, and should not be deemed as limitations to the scope of the present invention. It should be noted that variations and improvements will become apparent to those skilled in the art to which the present invention pertains without departing from its spirit and scope. Therefore, the scope of the present disclosure is defined by the appended claims.

The invention claimed is:

1. A scanning drive circuit, comprising a first scan driver for sequentially outputting selection signals and a second scan driver for sequentially outputting transmission signals, wherein the first scan driver comprises a plurality of first cascade structures and the second scan driver comprises a plurality of second cascade structures, each cascade structure of the first cascade structures and/or the second cascade structures comprises:

a first transistor, comprising an input terminal directly connected to a scanning signal output terminal or a scanning signal input terminal of a precedent cascade structure, a gate terminal directly connected to a first clock end, and an output terminal;

a second transistor, comprising a gate terminal directly connected to the output terminal of the first transistor, an input terminal directly connected to a second clock end, and an output terminal directly connected to the scanning signal output terminal;

a third transistor, comprising an input terminal directly connected to a first level end, a gate terminal directly connected to the scanning signal output terminal, and an output terminal;

a fourth transistor, comprising an input terminal directly connected to the output terminal of the third transistor, a gate terminal directly connected to the first clock end, and an output terminal directly connected to a second level end;

a fifth transistor, comprising an input terminal directly connected to the first level end, a gate terminal directly connected to the output terminal of the third transistor, and an output terminal directly connected to the scanning signal output terminal;

a sixth transistor, comprising an input terminal directly connected to the first level end, a gate terminal directly connected to the scanning signal output terminal, and an output terminal;

a seventh transistor, comprising an input terminal directly connected to the output terminal of the sixth transistor, a gate terminal directly connected to the first clock end, and an output terminal directly connected to the second level end;

an eighth transistor, comprising an input terminal directly connected to the first level end, a gate terminal directly connected to the scanning signal output terminal, and an output terminal directly connected to a driving signal output terminal;

a ninth transistor, comprising an input terminal directly connected to the driving signal output terminal, a gate terminal directly connected to the output terminal of the sixth transistor, and an output terminal directly connected to a third level end; and a first capacitor directly connected between the gate terminal and the output terminal of the second transistor.

2. The scanning drive circuit of claim 1, wherein the signals received by the first clock end and the second clock end of each cascade structure of the first cascade structures and the second cascade structures are the same in frequency, the signal received by the second clock end is at low level when the signal received by the first clock end is at high level, and the signal received by the second clock end is at high level when the signal received by the first clock end is at low level.

3. The scanning drive circuit of claim 2, wherein the first transistor, the second transistor, the third transistor, the fourth transistor, the fifth transistor, the sixth transistor, the seventh transistor, the eighth transistor and the ninth transistor are Thin Film Field Effect Transistors.

4. The scanning drive circuit of claim 1, wherein a second capacitor is connected between the first level end and the gate terminal of the sixth transistor.

5. The scanning drive circuit of claim 1, wherein a third capacitor is connected between the driving signal output terminal and the gate terminal of the ninth transistor.

6. The scanning drive circuit of claim 1, wherein a third capacitor is connected between the second level end and the gate terminal of the ninth transistor.

7. The scanning drive circuit of claim 6, wherein the third level end and the second level end are the same level end.

8. The scanning drive circuit of claim 6, wherein the voltage value inputted from the third level end is smaller than the voltage value inputted from the second level end.

9. The scanning drive circuit of claim 6, wherein the voltage inputted from the first level end is high level, and the voltages inputted from the second and third level ends are high level.

10. An organic light-emitting display, comprising a pixel circuit, a data driver and a timing controller, wherein the organic light-emitting display further comprises the scanning drive circuit of claim 1, the timing controller supplies timing signals and high and low level signals to the first clock end, the second clock end, the scanning signal input terminal, the first level end, the second level end and the third level end of the scanning drive circuit, the driving signal output terminal of the scanning drive circuit is connected to the driving signal input terminal of the pixel circuit so as to output driving signals for driving the pixel circuit to operate.

* * * * *